(12) United States Patent
Kubo (10) Patent No.: US 9,356,625 B2
(45) Date of Patent: May 31, 2016

(54) FRAME GENERATION METHOD, OPTICAL TRANSMISSION DEVICE, AND OPTICAL TRANSMISSION SYSTEM (75) Inventor: Kazuo Kubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 81 days.

(21) Appl. No.: 14/126,581

(22) PCT Filed: Dec. 8, 2011

(86) PCT No.: PCT/JP2011/078453
§ 371 (c)(1),
(2), (4) Date: Dec. 16, 2013

(87) PCT Pub. No.: WO2013/084341
PCT Pub. Date: Jun. 13, 2013

(65) Prior Publication Data
US 2014/0122978 A1 May 1, 2014

(51) Int. Cl.
*H03M 13/11* (2006.01)
*H03M 13/25* (2006.01)
(Continued)

(52) U.S. Cl.
CPC ........... *H03M 13/253* (2013.01); *H04J 3/1652* (2013.01); *H04L 1/0009* (2013.01); *H04L 1/0011* (2013.01); *H04L 1/0083* (2013.01); *H04L 1/0057* (2013.01)

(58) Field of Classification Search
CPC .. H03M 13/253; H04J 3/1652; H04L 1/0009; H04L 1/0011; H04L 1/0083; H04L 1/0057
See application file for complete search history.

(56) References Cited

U.S. PATENT DOCUMENTS 5,278,866 A 1/1994 Nonami
5,862,153 A 1/1999 Kikuchi et al.
(Continued)

FOREIGN PATENT DOCUMENTS

JP 4 276922 10/1992
JP 9 46321 2/1997
(Continued)

OTHER PUBLICATIONS

"OIF-FEC-100G-01.0" OIF Optical Internetworking Forum, http://www.oiforum.com/public/documents/OIF-FD-100G-DWDM-01.0.pdf, pp. 1-20, (May 2010).
(Continued)

*Primary Examiner* — Cynthia Britt
*Assistant Examiner* — Dipakkumar Gandhi
(74) *Attorney, Agent, or Firm* — Oblon, McClelland, Maier & Neustadt, L.L.P.

(57) ABSTRACT

A frame generation method in an optical transmission system that transmits a transmission frame including a payload area for storing therein information data and an FEC redundant area for storing therein an error correcting code with respect to the information data is provided, in which coding gain is calculated based on the quality of a communication path through which the transmission frame is transmitted, and, when it is determined that redundancy is insufficient with an error correcting code stored in the FEC redundant area based on the coding gain, a variable parity area for storing therein the error correcting code is set in the payload area and a transmission frame in which the error correcting code is stored in the FEC redundant area and the variable parity area is generated.

8 Claims, 9 Drawing Sheets (51) Int. Cl.
*H04J 3/16* (2006.01)
*H03M 13/53* (2006.01)
*H04L 1/00* (2006.01)

(56) References Cited

U.S. PATENT DOCUMENTS

| | | | |
|---|---|---|---|
| 6,868,514 | B2 | 3/2005 | Kubo et al. |
| 7,028,241 | B1 | 4/2006 | Blair et al. |
| 7,440,475 | B2 | 10/2008 | Kubo et al. |
| 2002/0129313 | A1 | 9/2002 | Kubo et al. |
| 2004/0170201 | A1 | 9/2004 | Kubo et al. |
| 2007/0264015 | A1* | 11/2007 | Li et al. ............... 398/45 |
| 2009/0044079 | A1 | 2/2009 | de Lind Van Wijngaarden et al. |
| 2009/0051822 | A1* | 2/2009 | Chang et al. ............ 348/726 |
| 2010/0080562 | A1 | 4/2010 | Perkins et al. |
| 2010/0229074 | A1 | 9/2010 | Shin et al. |
| 2011/0126074 | A1 | 5/2011 | Calderon et al. |
| 2012/0246537 | A1 | 9/2012 | Kubo et al. |
| 2012/0269511 | A1* | 10/2012 | Calderon et al. ........ 398/58 |
| 2013/0058643 | A1 | 3/2013 | Honma et al. |

FOREIGN PATENT DOCUMENTS

| | | |
|---|---|---|
| JP | 2002 290381 | 10/2002 |
| JP | 2004 104814 | 4/2004 |
| JP | 2010 278974 | 12/2010 |
| WO | WO 2009/020529 A2 | 2/2009 |
| WO | WO 2009/020529 A3 | 2/2009 |
| WO | 2011 068045 | 6/2011 |
| WO | 2011 135726 | 11/2011 |

OTHER PUBLICATIONS

Miyata, Y. et al., "A Triple-Concatenated FEC using Soft-Decision Decoding for 100 Gb/s Optical Transmission", OThL.3.pdf, OSA/OFC/NFOEC, total pages 3, (2010).

International Search Report Issued Feb. 28, 2012 in PCT/JP11/078453 Filed Dec. 8, 2011.

Japanese Office Action issued May 20, 2014, in Japan Patent Application No. 2013-548026 (with English translation).

Extended European Search Report issued Apr. 16, 2015 in Patent Application No. 11876944.7.

Office Action issued Feb. 3, 2016 in Chinese Patent Application No. 201180072319.X (with partial English translation).

* cited by examiner

FRAME GENERATION METHOD, OPTICAL TRANSMISSION DEVICE, AND OPTICAL TRANSMISSION SYSTEM

FIELD

The present invention relates to a frame generation method, an optical transmission device, and an optical transmission system.

BACKGROUND

When FEC is executed as an error correction technique, an FEC frame storing therein an error correcting code is used for data transmission. As a conventional FEC-frame configuring method in an optical communication system, a method of expanding a redundant area of an OTUk (Optical channel Transport Unit-k) frame has been applied (see, for example, Patent Literature 1).

Assuming that the redundant area of the OTUk frame is expanded, it has been suggested that a redundancy of 20% is appropriate taking into consideration a trade-off relation between an increase of transmission penalty due to an increase in the transmission rate and coding gain due to expansion of the redundant area (see, for example, Non Patent Literature 1).

In a digital optical transmission system, a method of providing a plurality of kinds of error correction circuits to switch the error correction circuits according to a state of a transmission path has been proposed (see, for example, Patent Literature 2).

CITATION LIST

Patent Literatures

Patent Literature 1: International Publication No. 2011/068045
Patent Literature 2: Japanese Patent Application Laid-open No. 2010-278974

Non Patent Literature

Non Patent Literature 1: OIF (Optical Internetworking Forum), "OIF-FEC-100G-01.0", May 2010

SUMMARY

Technical Problem

However, according to the conventional method of expanding the redundant area of the OTUk frame, the transmission rate increases. Therefore, when the redundancy exceeds 20% due to the trade-off relation with the transmission penalty, there are such problems that not only the transmission quality cannot be improved but also the transmission characteristic is deteriorated.

In the method of providing plural kinds of error correction circuits and switching the error correction circuits according to the state of the transmission path, adaptation to a transmission frame in optical communication is not taken into consideration, and there has been a problem in the adaptation method to the transmission frame in the optical communication.

The present invention has been achieved to solve the above problems, and an object of the present invention is to provide a frame generation method, an optical transmission device, and an optical transmission system that can configure an FEC frame having high compatibility with the transmission frame in optical communication and realize high-quality optical transmission, while avoiding an increase in the transmission rate.

Solution to Problem

To solve the above-mentioned problems, and to achieve the objective, the present invention is directed to a frame generation method in an optical transmission system that transmits a transmission frame including a payload area for storing therein information data and a code area for storing therein an error correcting code with respect to the information data, wherein the frame generation method comprises a coding-gain calculation step of calculating coding gain based on quality of a communication path through which the transmission frame is transmitted; and a transmission-frame generation step of setting a variable parity area for storing therein the error correcting code in the payload area and generating a transmission frame in which the error correcting code is stored in the code area and the variable parity area, when it is determined that redundancy is insufficient with an error correcting code stored in the code area based on the coding gain.

Advantageous Effects of Invention

The frame generation method according to the present invention can configure an FEC frame having high compatibility with a transmission frame in optical communication and realize high-quality optical transmission, while avoiding an increase in the transmission rate.

DESCRIPTION OF EMBODIMENTS

Exemplary embodiments of a frame generation method, an optical transmission device, and an optical transmission system according to the present invention will be explained below in detail with reference to the accompanying drawings. The present invention is not limited to the embodiments.

First Embodiment

Figure 1:
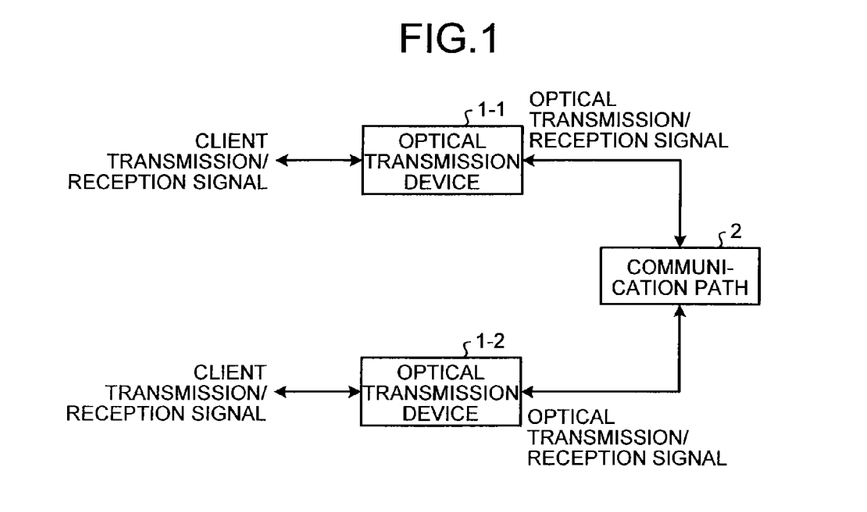
FIG. 1 is a diagram illustrating a configuration example of a digital optical transmission system according to a first embodiment.

FIG. 1 is a diagram illustrating a configuration example of a digital optical transmission system (hereinafter, "optical transmission system") according to a first embodiment of the present invention. As shown in FIG. 1, the optical transmission system according to the present embodiment includes optical transmission devices 1-1 and 1-2, and a communication path 2.

The optical transmission devices 1-1 and 1-2 perform inter-conversion between a client transmission/reception signal (an electrical signal expressing information data) and an optical transmission/reception signal, for example, mapping/demapping between a client signal and an optical transmission frame, error-correction coding and decoding, and electrical/optical conversion. The optical transmission devices 1-1 and 1-2 perform bidirectional communication through the communication path 2.

Figure 2:
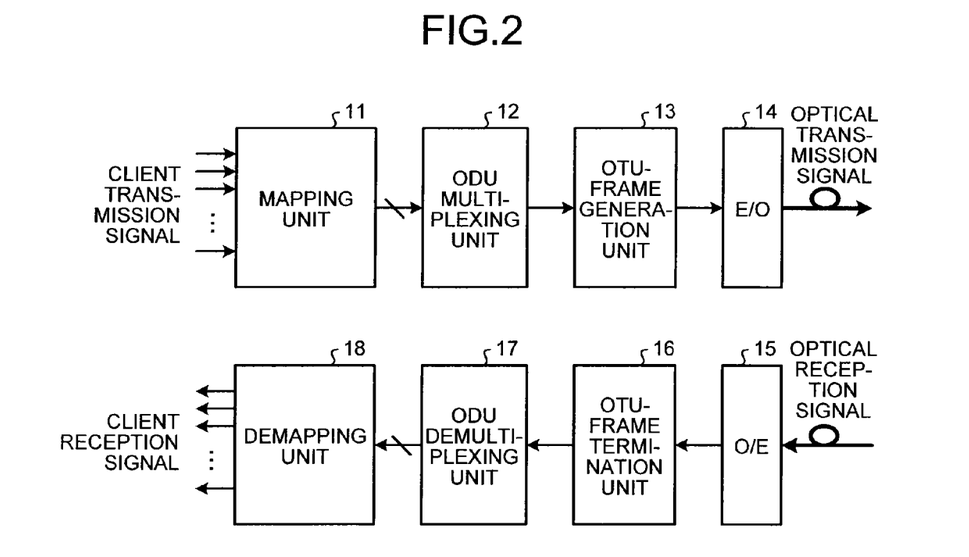
FIG. 2 is a configuration diagram of a functional configuration example of an optical transmission device.

FIG. 2 is a configuration diagram of a functional configuration example of the optical transmission device 1-1. The optical transmission device 1-2 has the same configuration as the optical transmission device 1-1. A mapping unit 11, an ODU (Optical channel Data Unit) multiplexing unit 12, an OTU-frame generation unit (transmission-frame generation unit) 13, and an electrical/optical conversion unit (E/O) 14 shown in the upper part in FIG. 2 constitute a transmission processing unit that performs a process of transmitting a client transmission signal as an optical transmission signal. An optical/electrical conversion unit (O/E) 15, an OTU-frame termination unit 16, an ODU demultiplexing unit 17, and a demapping unit 18 shown in the lower part in FIG. 2 constitute a reception processing unit that performs a reception process with respect to an optical reception signal.

The mapping unit 11 shown in FIG. 2 stores more than one client transmission signal, for example, a gigabit Ethernet (registered trademark) signal, a 10-gigabit Ethernet(registered trademark) signal, and a 100-Gbit Ethernet(registered trademark) signal or an STM-N(N=1, 4, 16, 64, 256) signal into an ODU frame. The ODU multiplexing unit 12 multiplexes a plurality of ODUs output from the mapping unit 11. The OTU-frame generation unit 13 performs addition of an OH (Over Head), error correction coding, and the like with respect to the multiplexed signal to generate an OTU frame. The E/O 14 performs electrical/optical conversion of the OTU (Optical channel transport Unit) frame and outputs the converted optical transmission signal to the communication path 2.

The O/E 15 performs optical/electrical conversion of an optical reception signal received through the communication path 2 to an electrical signal. The OTU-frame termination unit 16 performs various OH processing, error correction decoding, and the like with respect to the electrical signal. The ODU demultiplexing unit 17 demultiplexes more than one ODU multiplexed and stored in the OTU frame. The demapping unit 18 demaps a data signal stored in the respective demultiplexed ODUs and outputs the transmitted original client signal (a client reception signal).

Figure 3:
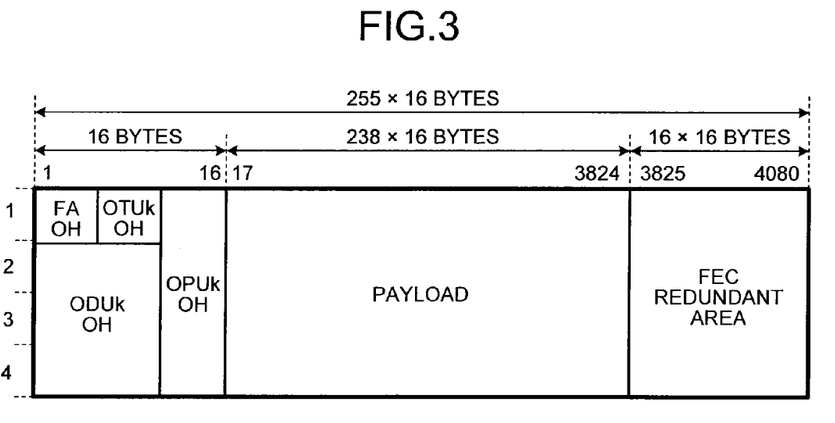
FIG. 3 is a diagram illustrating a frame configuration of an OTUk frame shown in ITU-T Recommendation G.709.

For example, an OTUk frame can be used as the OTU frame. FIG. 3 is a diagram illustrating a frame configuration of an OTUk frame shown in ITU-T Recommendation G.709. As shown in FIG. 3, the OTUk frame comprises a payload for storing therein actual communication data such as a client signal, an FA OH (Frame Alignment OverHead) for frame synchronization, an OTUk OH and an ODUk OH (Optical channel Data Unit-k OverHead) for maintenance and monitoring information, and an OPUk OH (Optical channel Payload Unit-k) for payload mapping, and further includes an FEC redundant area for storing therein error correcting code information to correct a bit error due to deterioration of the optical quality after transmission. A Reed-Solomon code (hereinafter, "RS code") (255, 239) is usually used as the error correcting code. Generally, a part comprising the FA OH, the OTUk OH, the ODUk OH, and the OPUk OH is referred to as "overhead". The error correcting code is not limited to the RS code (255, 239).

In this manner, in the optical transmission system, a transmission frame in which the overhead and the error correcting code are added to the payload, which is information data to be actually transmitted, is formed and transmitted at a high speed and over a long distance.

Figure 4:
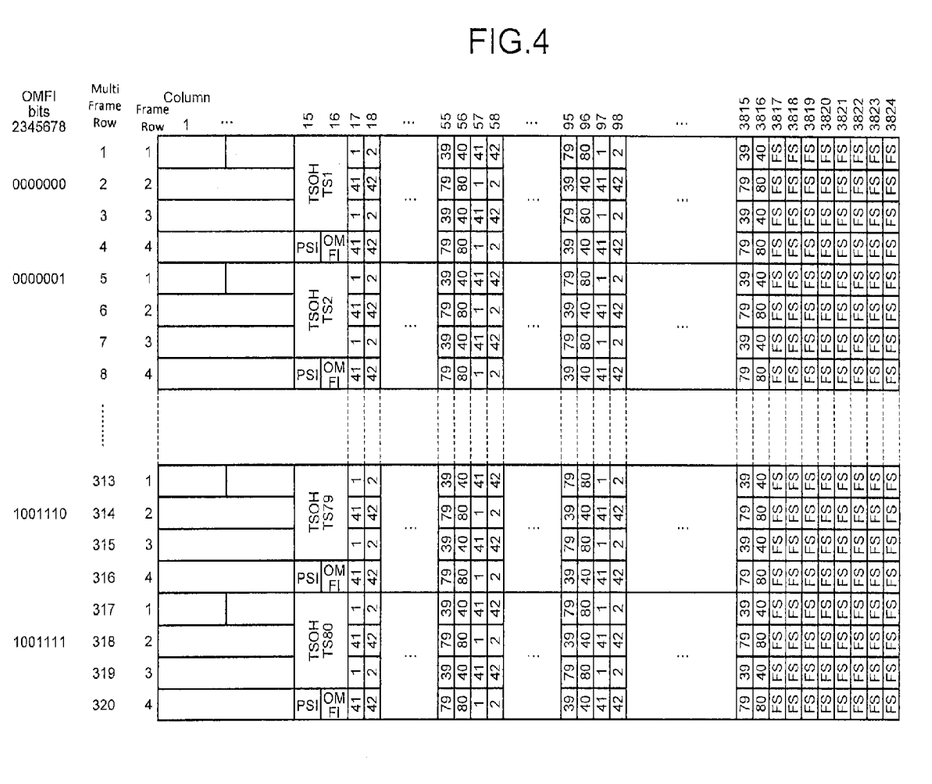
FIG. 4 is an explanatory diagram of allocation of OPUk tributary slots (k=4).

This operation is explained next with reference to the drawings. FIG. 4 is an explanatory diagram of allocation of OPUk tributary slots (k=4) shown in ITU-T Recommendation G.709, in the OTU-k frame (k=4) shown in FIG. 3. Tributary slots No. 1 to No. 80 are allocated to a payload area, and 3817th to 3824th rows are fixed stuffs (FSs).

When gigabit Ethernet signals for 80 channels are multiplexed and stored in the tributary slots, the gigabit Ethernet signal for the first channel can be stored in the tributary slot No. 1 and the gigabit Ethernet signal for the second channel can be stored in the tributary slot No. 2. The same applies hereinafter and the gigabit Ethernet signal for the 80th channel can be stored in the tributary slot No. 80. When 10-gigabit Ethernet signals for 10 channels are multiplexed, for example, the 10-gigabit Ethernet signal for the first channel can be stored in the tributary slot Nos. 1 to 8 and the 10-gigabit Ethernet signal for the second channel can be stored in the tributary slot Nos. 9 to 16. The same applies hereinafter, and the 10-gigabit Ethernet signal for the 10th channel can be stored in the tributary slot Nos. 73 to 80.

An example where the tributary slot numbers for storing each channel are sequence numbers such as 1 to 8 has been explained. However, the allocation is not limited to sequence number allocation, and a 10-gigabit Ethernet signal for an arbitrary channel can be associated with arbitrary tributary slots to be stored in eight tributary slots in total. Furthermore, a plurality of kinds of client signals can be mixed and stored in eighty tributary slots.

Figure 5:
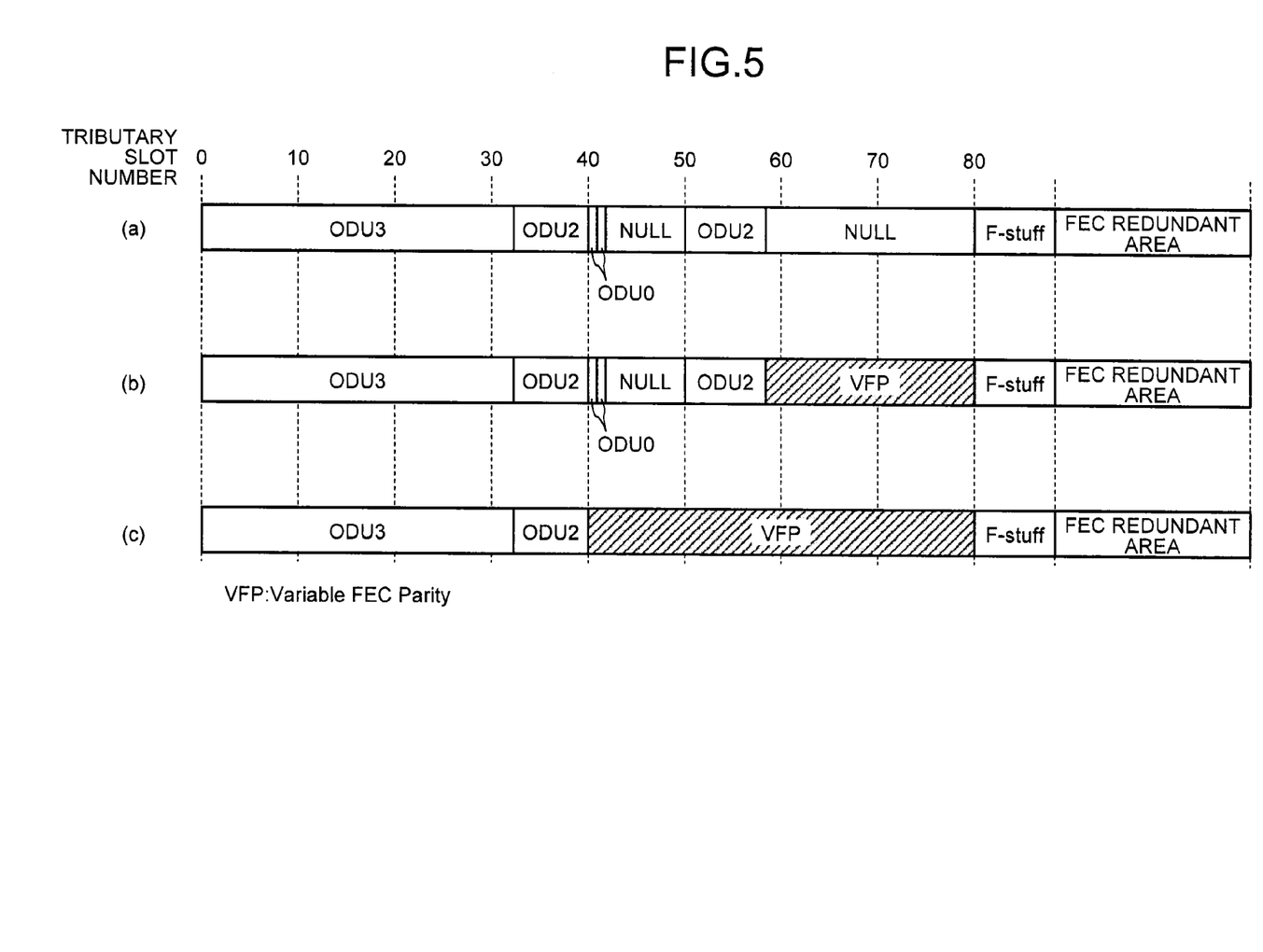
FIG. 5 is explanatory diagram of an example of tributary slot allocation of a client signal and allocation of a variable FEC parity.

FIG. 5 is an explanatory diagram of an example of tributary slot allocation of a client signal and allocation of a variable FEC parity (VFP). In a figure (a) of FIG. 5, a case where an ODU3 (Optical channel Data Unit 3) of one channel is stored, ODU2s of two channels are stored, and ODU0s of two channels are stored is shown. The ODU3 is the name of a unit that stores therein a 40-gigabit STM-256 signal and the like as the client signal, the ODU2 is the name of a unit that stores therein a 10-gigabit STM-64 signal, a 10-gigabit Ethernet signal, and the like, and the ODU0 is the name of a unit that stores therein a gigabit Ethernet signal of 1.25 gigabit and the like.

It is assumed here that the error correcting code in which characteristic deterioration of the communication path 2 shown in FIG. 1 is large and predetermined transmission quality cannot be satisfied by the error correcting code using only an FEC redundant area shown in the figure (a) of FIG. 5. In this case, as shown in a figure (b) of FIG. 5, it is configured that a position of a vacant tributary slot number corresponding to a NULL portion is used as the variable FEC parity by the error correcting code. When the predetermined transmission quality cannot be achieved even if it is configured as shown in the figure (b) of FIG. 5, tributary slots that can be used by a user data signal to be stored are limited to expand a VFP area as shown in a figure (c) of FIG. 5.

Figure 6:
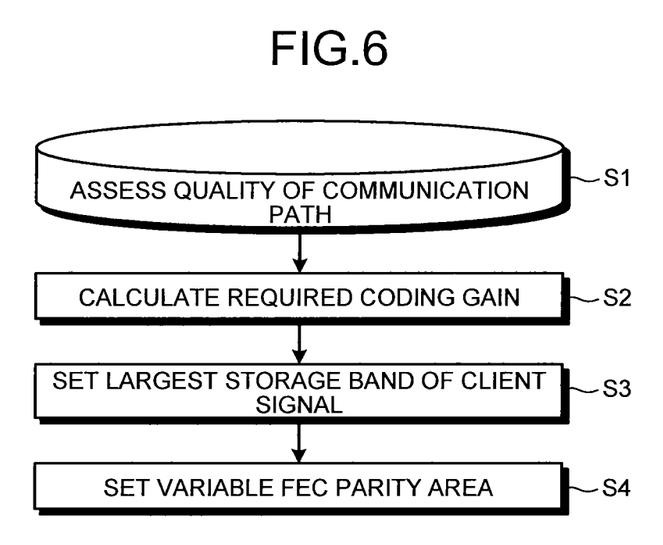
FIG. 6 is a flowchart of an example of a tributary-slot allocation procedure.

FIG. 6 is a flowchart of an example of a tributary-slot allocation procedure (a frame generation procedure). First, the optical transmission devices 1-1 and 1-2 assess the quality of the communication path 2 of the optical transmission system (Step S1), and calculates coding gain to be required (Step S2). Specifically, the optical transmission devices 1-1 and 1-2 each include a coding-gain calculation unit that assesses the transmission quality such as a bit error in the optical reception signal and calculates coding gain based on an assessment result, for example. A transmission-quality assessment unit is provided in, for example, in the OTU-frame termination unit 16. Alternatively, a transmission end can sequentially increase the parity to be added by using an actual OTUk frame and the OTU-frame termination unit 16 on a reception end can determine coding gain that causes no error. The assessment method for the quality of the communication path 2 is not limited to these methods.

Accordingly, the number of tributary slots to be required for the VFP is determined. Therefore, the OTU-frame generation unit 13 of each of the optical transmission devices 1-1 and 1-2 sets the largest storage band in which the client signal is stored and a variable FEC parity area based on the number of tributary slots to be required for the VFP (Steps S3, Step S4).

A single error correcting code may be used for the variable FEC parity area and the FEC redundant area, and a concatenated or iterated code using a plurality of error correcting codes, or a plurality of independent error correcting codes can be used. Furthermore, the error correcting codes can use the variable FEC parity area and the FEC redundant area at an arbitrary ratio. For each code, any error correcting code such as the RS code, a BCH code, or an LDPC code can be used, and an arbitrary combination of these error correcting codes can be used. On the reception end, an error correction algorithm by soft-decision decoding or repetitive decoding can be used.

An example in which the optical transmission devices 1-1 and 1-2 respectively calculate coding gain has been explained above. However, any one of the optical transmission devices 1-1 and 1-2 can calculate the coding gain and inform the other of the coding gain. Furthermore, the coding gain can be calculated by a monitoring control device or the like (not shown) that manages operations of the optical transmission devices 1-1 and 1-2 and the optical transmission devices 1-1 and 1-2 can be informed of the coding gain.

Figure 7:
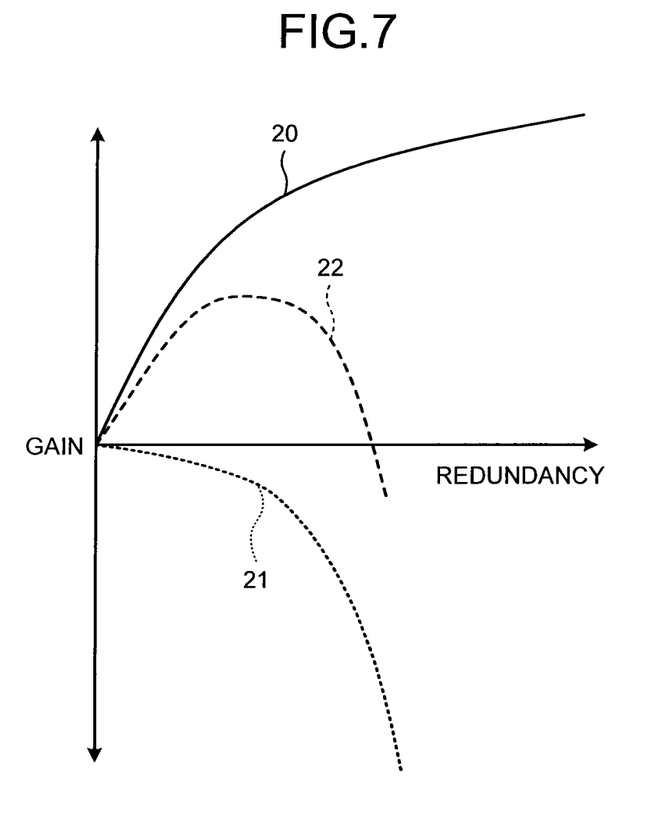
FIG. 7 is an explanatory diagram illustrating an effect of the first embodiment.

FIG. 7 is an explanatory diagram of an effect of the present embodiment, in which the horizontal axis represents redundancy of the FEC and the vertical axis represents gain. A solid line represents FEC coding gain (coding gain obtained when the redundancy is increased) 20, band limitation 21 represented by a dotted line indicates gain by band limitation, and a broken line represents effective coding gain 22. As explained in the conventional technique, according to the conventional method of expanding the redundant area, when the transmission rate increases with an increase in the redundancy of the FEC, penalty by the band limitation 21 increases and improvement of the effective coding gain 22 of the FEC including the FEC coding gain 20 and the band limitation 21 is limited.

On the other hand, the present embodiment is configured in such a manner that the tributary slots in the payload area are used as the variable FEC parity assuming that the transmission rate is constant. Therefore, even if the redundancy of the FEC is increased, there is no influence of the band limitation, and effective FEC coding gain equivalent to the FEC coding gain 20 indicated by the solid line in FIG. 7 can be achieved. Because the variable FEC parity area is increased or decreased in units of tributary slots, a special ODU multiplexing method is not required, and thus compatibility with the optical transmission frame is high, and an increase of the circuit size can be suppressed, thereby enabling to achieve power saving. Furthermore, because the transmission rate is constant while the redundancy is variable, performance such as the operation speed and the bandwidth required for high-speed components constituting the E/O 14 and the O/E 15 is constant, and tests at a plurality of speeds are not required, thereby enabling to improve mass productivity and to realize cost reduction.

Figure 8:
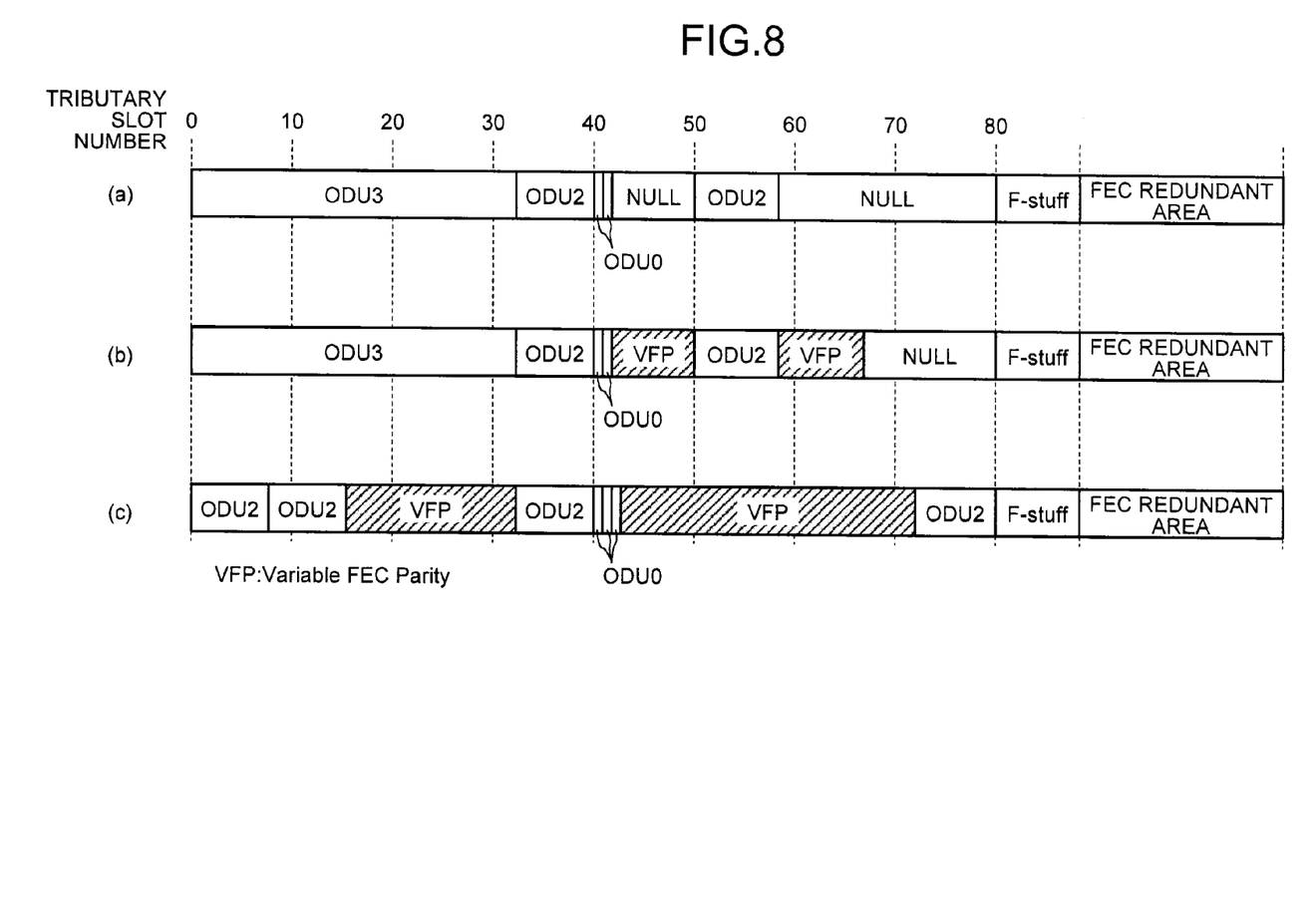
FIG. 8 is a diagram illustrating a frame configuration example in which a variable FEC parity is allocated to tributary slots, which are non-contiguous.

In the present embodiment, an example in which the variable FEC parity is allocated to the contiguous tributary slots is shown. However, as shown in FIG. 8, the variable FEC parity can be allocated to arbitrary tributary slot positions. FIG. 8 is a frame configuration example in which a variable FEC parity is allocated to tributary slots, which are non-contiguous. A fixed stuff area (F-stuff) can be also used as a variable FEC parity area.

While allocation of the variable FEC parity area in the OTUk frame is explained in the present embodiment, not only the OTUk frame but also a frame that stores therein data for payload for storing information data and a code area for storing an error correcting code corresponding to the information data can be used as a storage area of the variable FEC parity area by reducing the NULL portion or a portion for storing the information data of the payload in the same manner.

Second Embodiment

Figure 9:
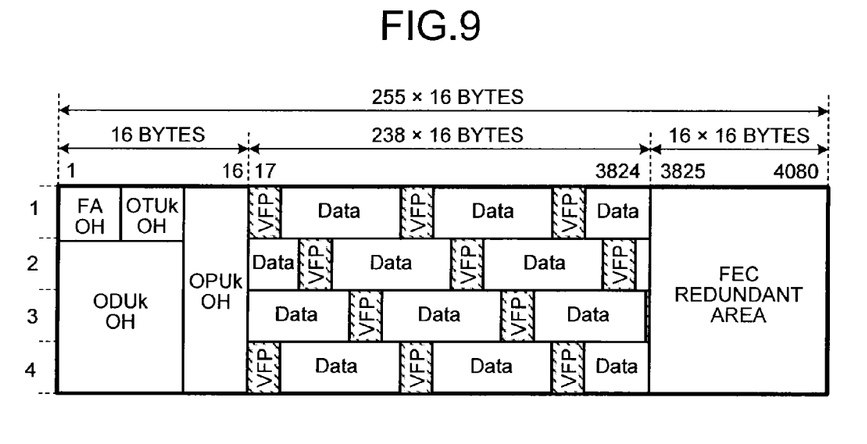
FIG. 9 is a diagram illustrating an example of an allocation method of a variable FEC parity area according to a second embodiment.

FIG. 9 is an example of an allocation method of a variable FEC parity area according to a second embodiment of the present invention. The configuration of the optical transmission system and the configuration of the optical transmission devices 1-1 and 1-2 according to the present embodiment are the same as those of the first embodiment. Parts different from the first embodiment are explained below.

In the first embodiment, an example in which a variable FEC parity area is set in units of tributary slots that store therein user data is shown. However, a fixed stuff area by a GMP (Generic Mapping Procedure) shown in ITU-T Recommendation G.709 can be used as the variable FEC parity (VFP) area. In this case, the GMP interpolates a frequency difference between a payload area and the user data by inserting the fixed stuffs dispersively. FIG. 9 is an example in which areas into which fixed stuffs are inserted by the GMP are used as a variable FEC parity.

Figure 10:
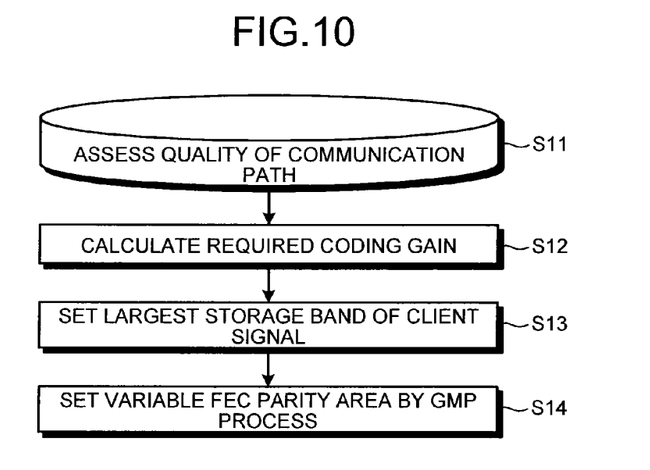
FIG. 10 is a flowchart of an example of a tributary-slot allocation procedure according to the second embodiment.

FIG. 10 is a flowchart of an example of a tributary-slot allocation procedure (a frame generation procedure) according to the present embodiment. First, the optical transmission devices 1-1 and 1-2 assess the quality of the communication path of the optical transmission system (Step S11), and calculates coding gain to be required (Step S12), as in the first embodiment. Accordingly, the redundancy to be required for the VFP is determined. Therefore, the optical transmission devices 1-1 and 1-2 set the largest storage band of the client signal (Step S13) and set the fixed stuffs obtained by the GMP process as a variable FEC parity area (Step S14).

FIG. 10 illustrates an allocation example of a variable FEC parity when the client signal is stored in the entire payload area by the GMP. However, when a plurality of ODUs such as the ODU0, the ODU2, and the ODU3 are included, for example, as shown in FIG. 5, the fixed stuffs by the GMP used at the time of storing the user signal can be used as the variable FEC parity in each ODU. Operations of the present embodiment other than those described above are the same as the first embodiment.

The allocation of the variable FEC parity to the tributary slots shown in the first embodiment and the allocation of the variable FEC parity to the fixed stuffs by the GMP shown in the present embodiment can be used together.

As described above, in the present embodiment, the variable FEC parity is allocated to the fixed stuffs by the GMP. Therefore, high-quality optical transmission can be realized in which compatibility with the optical transmission frame is high, and the transmission rate is not increased even if the redundancy of the FEC is increased.

Third Embodiment

Figure 11:
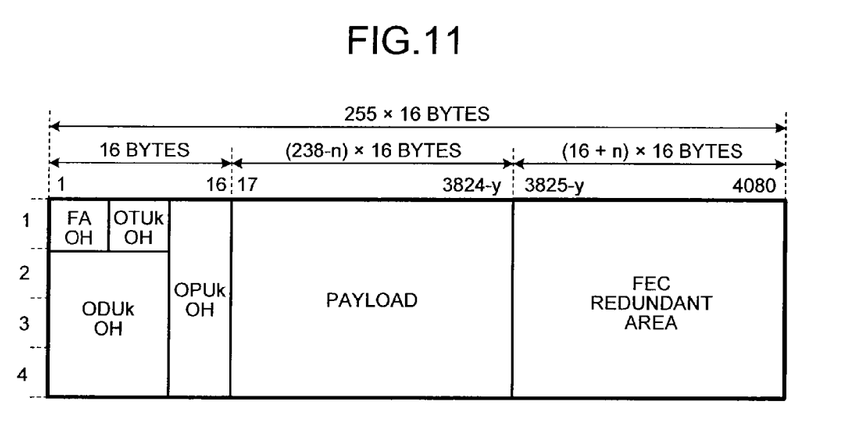
FIG. 11 is a diagram illustrating an example of an allocation method of a variable FEC parity area according to a third embodiment.

FIG. 11 is a diagram illustrating an example of an allocation method of a variable FEC parity area according to a third embodiment of the present invention. The configuration of the optical transmission system and the configuration of the optical transmission devices 1-1 and 1-2 according to the present embodiment are the same as those of the first embodiment. Parts different from the first embodiment are explained below.

In the first and second embodiments, examples in which the tributary slots in a payload area or fixed stuffs by the GMP at the storing are used as a variable FEC parity are shown. However, as shown in FIG. 11, a ratio between the payload area and an FEC parity redundant area can be changed by y rows. That is, the FEC parity redundant area can be increased by y rows and the payload area can be decreased by y rows. That is, the increased y rows become the variable FEC parity area. Operations of the present embodiment other than those described above are the same as the first embodiment.

Furthermore, any one or both of the allocation of the variable FEC parity to the tributary slots shown in the first embodiment and the allocation of the variable FEC parity to the fixed stuffs by the GMP shown in the second embodiment can be used together with allocation of the variable FEC parity of the third embodiment.

As described above, in the present embodiment, the ratio between the payload area and the FEC parity redundant area is changed by y rows. Therefore, high-quality optical transmission can be realized in which compatibility with the optical transmission frame is high, and the transmission rate is not increased even if the redundancy of the FEC is increased.

Fourth Embodiment

Figure 12:
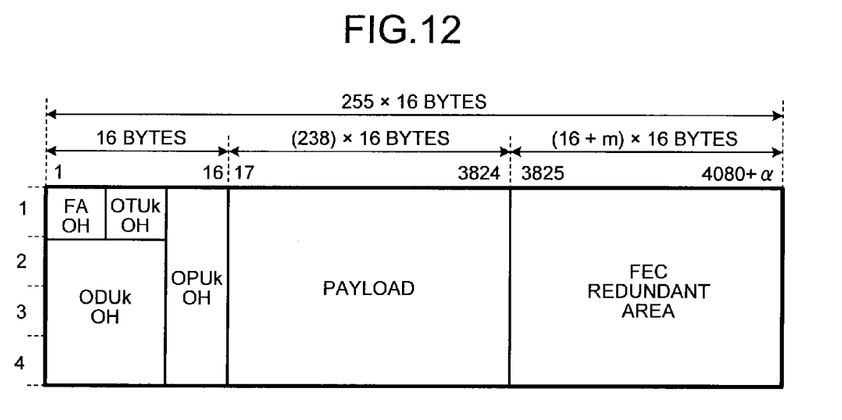
FIG. 12 is a diagram illustrating an example of an allocation method of a variable FEC parity area according to a fourth embodiment.

FIG. 12 is an example of an allocation method of a variable FEC parity area according to a fourth embodiment of the present invention. The configuration of the optical transmission system and the configuration of the optical transmission devices 1-1 and 1-2 according to the present embodiment are the same as those of the first embodiment. Parts different from the first embodiment are explained below.

In the first, second, and third embodiments, examples in which an FEC parity redundant area of the OTUk frame is set up to the 4080th row, and a part of the payload area is allocated to the variable FEC parity are shown. However, as shown in FIG. 12, variable allocation in which the FEC redundant area is expanded and the allocation of the variable FEC parity in the payload area by at least one of the methods according to the first, second, and third embodiments can be used together.

As described above, while the transmission rate increases only with the method of expanding the FEC redundant area, an amount of expanding the FEC redundant area can be reduced and an increase in the transmission rate can be suppressed by using the method together with allocation of the variable FEC parity in the payload area.

INDUSTRIAL APPLICABILITY

As described above, the frame generation method, the optical transmission device, and the optical transmission system according to the present invention are useful for an optical transmission system that transmits a frame storing therein an error correcting code.

REFERENCE SIGNS LIST

1-1, 1-2 optical transmission device
2 communication path
11 mapping unit
12 ODU multiplexing unit
13 OTU-frame generation unit
14 E/O
15 O/E
16 OTU-frame termination unit
17 ODU demultiplexing unit
18 demapping unit
20 FEC coding gain
21 band limitation
22 effective coding gain

The invention claimed is:

1. A frame generation method in an optical transmission system that transmits a transmission frame including a payload area for storing therein information data and a code area for storing therein an error correcting code with respect to the information data, the frame generation method comprising:
   a coding-gain calculation step of calculating coding gain based on quality of a communication path through which the transmission frame is transmitted; and
   a transmission-frame generation step of setting a variable parity area for storing therein the error correcting code in the payload area and generating a transmission frame in which the error correcting code is stored in the code area and the variable parity area, when it is determined that redundancy is insufficient with an error correcting code stored in the code area based on the coding gain,
   wherein tributary slots are allocated to the payload area, and
   the variable parity area is set in units of the tributary slots in the transmission frame generation step.

2. The frame generation method according to claim 1, wherein the transmission frame is an OTUk frame shown in ITU-T Recommendation G.709 or a frame in which an FEC redundant area of the OTUk frame is expanded, and the tributary slots are OPUk tributary slots shown in ITU-T Recommendation G.709.

3. The frame generation method according to claim 1, wherein
   the code area is set as an FEC redundant area, and
   the variable parity area is set in units of rows from a side adjacent to the FEC redundant area in the payload area.

4. The frame generation method according to claim 1, wherein an area in which NULL data is stored in the payload area is set as the variable parity area.

5. The frame generation method according to claim 1, wherein a fixed stuff area in the payload area is set as the variable parity area.

6. The frame generation method according to claim 1, wherein a fixed stuff area by a GMP shown in ITU-T Recommendation G.709 in the payload area is set as the variable parity area.

7. An optical transmission device that transmits a transmission frame including a payload area for storing therein information data and a code area for storing therein an error correcting code with respect to the information data, the optical transmission device comprising:
 a coding-gain calculation unit configured to calculate coding gain based on quality of a communication path through which the transmission frame is transmitted; and
 a transmission-frame generation unit configured to set a variable parity area for storing therein an error correcting code in the payload area and generate a transmission frame in which the error correcting code is stored in the code area and the variable parity area, when it is determined that redundancy is insufficient with an error correcting code stored in the code area based on the coding gain,
 wherein tributary slots are allocated to the payload area, and
 the transmission-frame generation unit sets the variable parity area in units of the tributary slots.

8. An optical transmission system that transmits a transmission frame including a payload area for storing therein information data and a code area for storing therein an error correcting code with respect to the information data, the optical transmission system comprising:
 a first optical transmission device including:
  a coding-gain calculation unit configured to calculate coding gain based on quality of a communication path through which the transmission frame is transmitted; and
  a transmission-frame generation unit configured to set a variable parity area for storing therein an error correcting code in the payload area and generate a transmission frame in which the error correcting code is stored in the code area and the variable parity area, when it is determined that redundancy is insufficient with an error correcting code stored in the code area based on the coding gain, wherein tributary slots are allocated to the payload area, and the transmission-frame generation unit sets the variable parity area in units of the tributary slots; and
 a second optical transmission device configured to receive the transmission frame from the first optical transmission device and perform error decoding of information data stored in the received transmission frame based on the error correcting code stored in the transmission frame.

* * * * *